US 6,570,423 B1

(12) United States Patent
Trivedi et al.

(10) Patent No.: US 6,570,423 B1
(45) Date of Patent: May 27, 2003

(54) PROGRAMMABLE CURRENT SOURCE ADJUSTMENT OF LEAKAGE CURRENT FOR PHASE LOCKED LOOP

(75) Inventors: Pradeep R. Trivedi, Sunnyvale, CA (US); Claude R. Gauthier, Cupertino, CA (US); Sudhakar Bobba, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/230,596

(22) Filed: Aug. 29, 2002

(51) Int. Cl.$^7$ .................................................. H03L 7/06
(52) U.S. Cl. .................. 327/157; 327/156; 327/159
(58) Field of Search ................................ 327/156–159, 327/382; 375/376

(56) References Cited

U.S. PATENT DOCUMENTS 6,473,485 B1 * 10/2002 Fernandez-Texon ........ 327/148

* cited by examiner

*Primary Examiner*—Kenneth B. Wells
(74) *Attorney, Agent, or Firm*—Rosenthal & Osha L.L.P.

(57) ABSTRACT

A method and apparatus for post-fabrication adjustment of a phased locked loop leakage current is provided. The adjustment system includes a programmable current source that adjusts a leakage current offset circuit to compensate for the leakage current of a capacitor. The capacitor connects to a control voltage of the phase locked loop. The programmable current source includes at least one current source and switch to adjust the leakage current offset circuit. The programmable current source is selectively adjusted by a combinational logic circuit. Such control of the leakage current in the phased locked loop allows a designer to achieve a desired phase locked loop operating characteristic after fabrication of the adjustable phase locked loop.

21 Claims, 8 Drawing Sheets

PROGRAMMABLE CURRENT SOURCE ADJUSTMENT OF LEAKAGE CURRENT FOR PHASE LOCKED LOOP

BACKGROUND OF INVENTION

Figure 1:
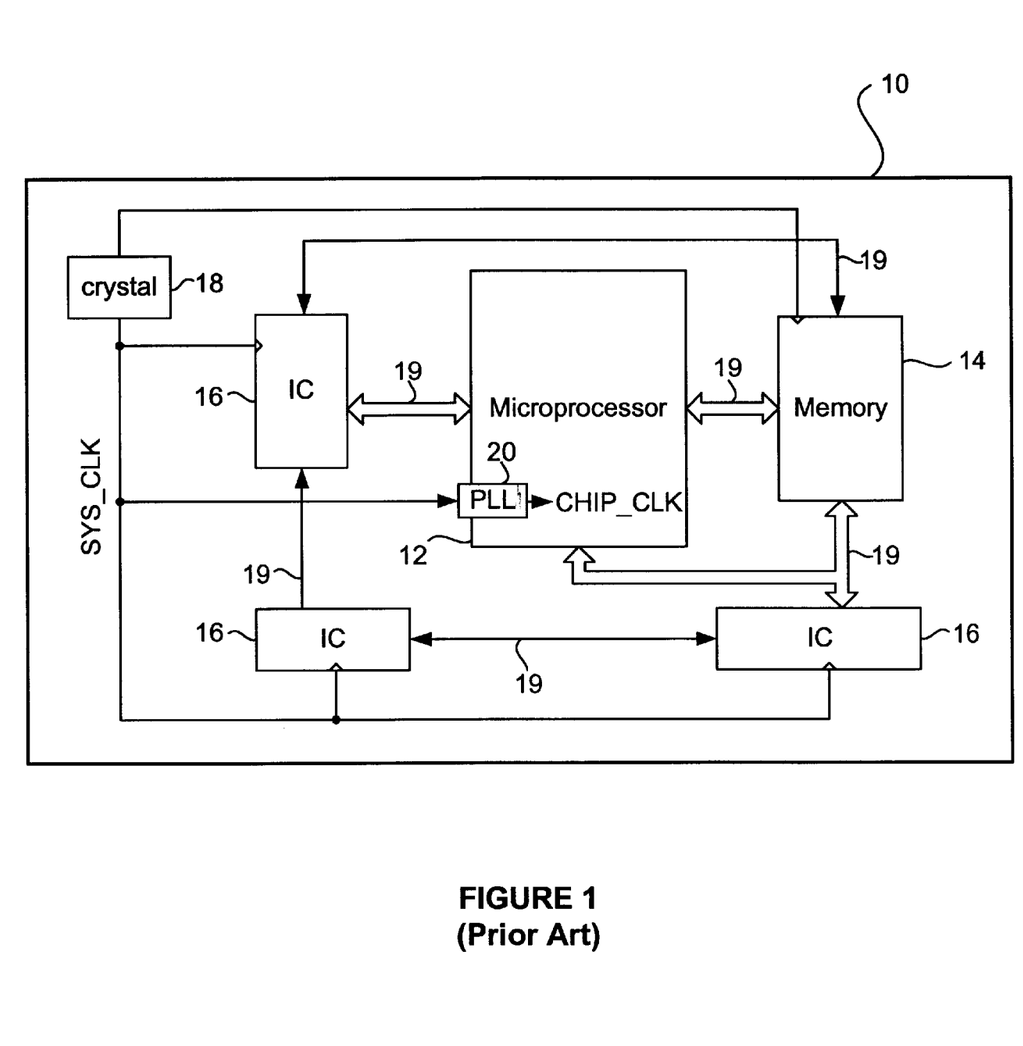
FIG. 1 shows a typical computer system component.

As shown in FIG. 1, a typical computer system (10) has, among other components, a microprocessor (12), one or more forms of memory (14), integrated circuits (16) having specific functionalities, and peripheral computer resources (not shown), e.g., monitor, keyboard, software programs, etc. These components communicate with one another via communication paths (19), e.g., wires, buses, etc., to accomplish the various tasks of the computer system (10).

In order to properly accomplish such tasks, the computer system (10) relies on the basis of time to coordinate its various operations. To that end, a crystal oscillator (18) generates a system clock signal (referred to and known in the art as "reference clock" and shown in FIG. 1 as SYS_CLK) to various parts of the computer system (10). Modern microprocessors and other integrated circuits, however, are typically capable of operating at frequencies significantly higher than the system clock signal, and thus, it becomes important to ensure that operations involving the microprocessor (12) and the other components of the computer system (10) use a proper and accurate reference of time.

One component used within the computer system (10) to ensure a proper reference of time among the system clock signal and a microprocessor clock signal, i.e., "chip clock signal" or CHIP_CLK, is a type of clock generator known as a phase locked loop (PLL) (20). The PLL (20) is, an electronic circuit that controls an oscillator such that the oscillator maintains a constant phase relative to the system clock signal. Referring to FIG. 1, the PLL (20) has as its input the system clock signal, which is its reference signal, and outputs a chip clock signal (shown in FIG. 1 as CHIP_CLK) to the microprocessor (12). The system clock signal and chip clock signal have a specific phase and frequency relationship controlled by the PLL (20). This relationship between the phases and frequencies of the system clock signal and chip clock signal ensures that the various components within the microprocessor (12) use a controlled and accounted for reference of time. When this relationship is not maintained by the PLL (20), however, the operations within the computer system (10) become non-deterministic.

Figure 2:
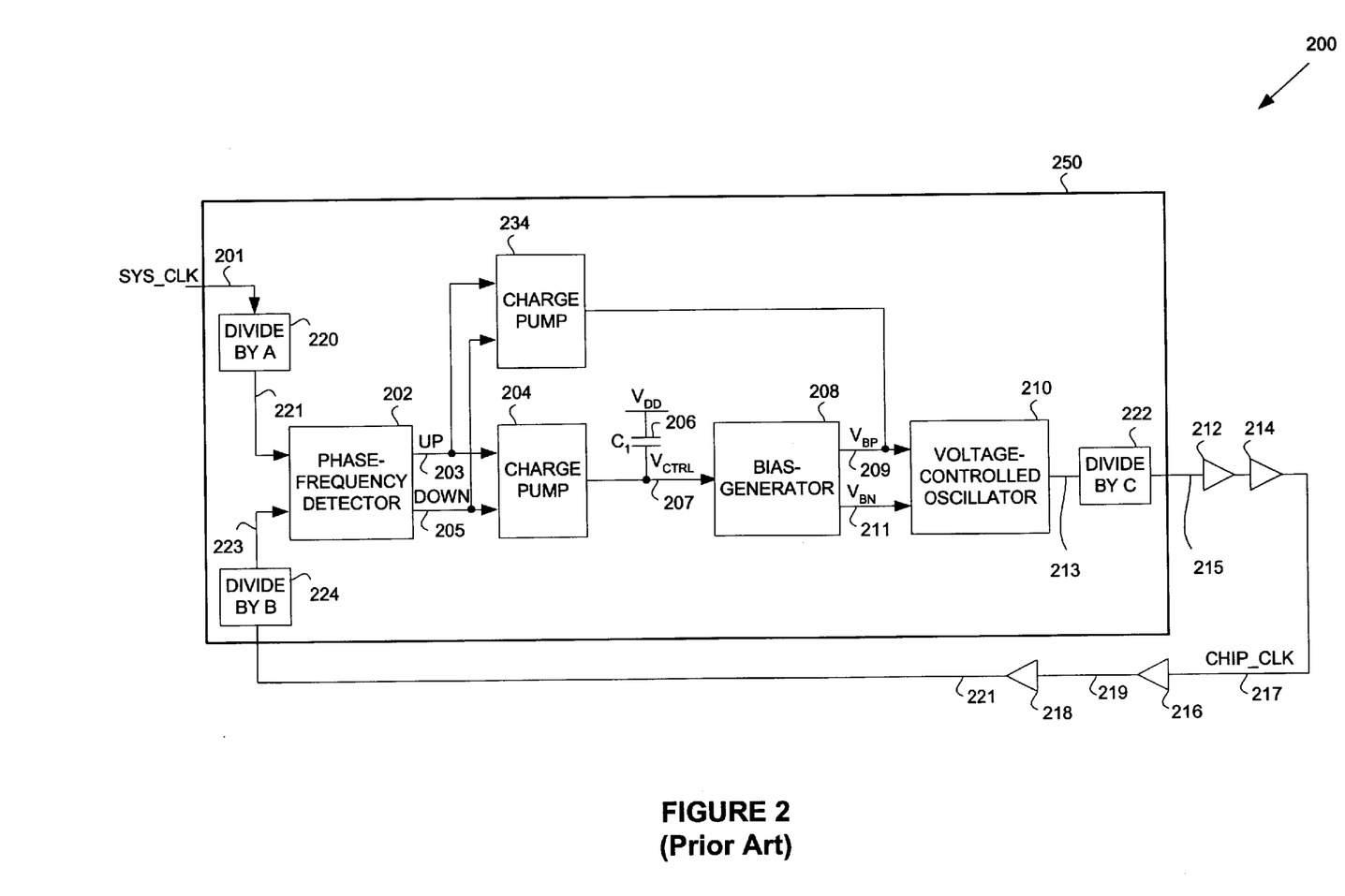
FIG. 2 shows a block diagram of a prior art phase locked loop.

FIG. 2 shows a block diagram of a typical PLL (200). The PLL (200) includes a PLL core (250), buffers (212, 214, 216, 218), and a feedback loop signal (221) on a feedback loop path. The buffers (212, 214) increase the drive strength of an output clock signal (215) to supply other circuits of the microprocessor (12 in FIG. 1) with a chip clock signal (217). The buffers (216, 218) buffer the chip clock signal (217) to additional circuits of the microprocessor (12 in FIG. 1). The time delay created by the buffers (212, 214, 216, 218) is accounted for in the feedback signal (221) that is supplied to the PLL core (250).

The PLL core (250) is designed to output the chip clock signal (217), which is a multiple of the system clock signal (201). When the PLL is in "lock," the chip clock signal (217) and system clock signal (201) maintain a specific phase relationship. To allow different multiplication ratios, the PLL core (250) may use several "divide by" circuits. A "divide by" circuit reduces the frequency of the input to the "divide by" circuit at its output by a specified factor. For example, the PLL core (250) uses a divide by A circuit (220) with the system clock signal (201), a divide by C circuit (222) with a voltage-controlled oscillator (210) output signal (213), and a divide by B circuit (224) with the feedback loop signal (221).

A phase-frequency detector (202) aligns the transition edge and frequency of a clock A signal (221) and a clock B signal (223). The phase-frequency detector (202) adjusts its output frequency in order to zero any phase and frequency difference between the clock A signal (221) and the clock B signal (223). The phase-frequency detector (202) produces signals that control charge pumps (204, 234). The phase-frequency detector (202), using control signals up (203) and down (205), controls the charge pumps (204, 234) to increase or decrease their output. The charge pump (204) adds or removes charge from a capacitor Cl (206) that changes the voltage potential at the input of a bias-generator (208). The capacitor (206) is connected between a power supply $V_{DD}$ and a control voltage $V_{CTRL}$ (207). The charge pump (234) adds or removes charge from a bias voltage $V_{BP}$ (209) of a bias-generator (208).

The bias-generator (208) produces bias voltages $V_{BP}$ (209) and $V_{BN}$ (211) in response to the control voltage (207). The PLL core (250) may be self-biased by adding the charge pump (234) to the bias-generator (208) bias voltage $V_{BP}$ (209). The addition of a second charge pump (234) allows the removal of a resistor in series with the capacitor (206). A voltage-controlled oscillator (210) produces an output signal (213) that has a frequency related to the bias voltages $V_{BP}$ (209) and $V_{BN}$ (211).

The "divide by" circuits (220, 222, 224) determine the frequency multiplication factor provided by the PLL core (250). The addition of "divide by" circuits (220, 222, 224) enables the PLL core (250) to multiply the system clock signal (201). Multiplying the system clock signal (201) is useful when the chip clock signal (217) must have a higher frequency than the system clock signal (201).

For example, during normal operation, the variables A and C may both be set to one in the divide by A circuit (220) and divide by C circuit (222), respectively. The variable B may be set to 10 in the divide by B circuit (224). The phase-frequency detector (202) aligns the transition edge and frequency of the clock A signal (221) and the clock B signal (223). The phase-frequency detector (202) adjusts PLL core (250) output clock signal (215) frequency in order to zero any phase and frequency difference between the clock A signal (221) and the clock B signal (223). Because the clock B signal (223) has a divide by B circuit (224) that reduces its input frequency by 10, the phase-frequency detector (202) adjusts the voltage-controlled oscillator (210) output signal (213) to a frequency 10 times greater than the clock A signal (221). Accordingly, the chip clock signal (217) is 10 times higher in frequency than the system clock signal (201).

The power consumption of a microprocessor is of concern. Reducing the frequency of the chip clock signal (217) reduces the switching rate of other circuits in the microprocessor (12 in FIG. 1). A low power mode may be entered when there is no activity in the microprocessor for an extended period of time. A slower switching rate typically reduces the power consumption of a microprocessor (12 in FIG. 1).

A change in the frequency of the chip clock signal (217) is accomplished by changing the ratio in the divide by circuits (220, 222, 224). For example, during reduced power operation, the variable A may be set to 16 in the divide by A circuit (220); the variable B may be set to 5 in the divide by B circuit (224); and the variable C may be set to 32 in the divide by C circuit (222). In this example, the frequency of the chip clock signal (217) is 5/16 times the system clock signal (201). Also, the phase-frequency detector (202) updates 16 times less frequently compared to the non-reduced power example above.

Proper operation of the microprocessor (12 shown in FIG. 1) depends on the PLL (200) maintaining a constant phase and frequency relationship between the system clock signal (201) and the chip clock signal (217).

SUMMARY OF INVENTION

According to one aspect of the present invention, an integrated circuit including a clock path arranged to carry a clock signal; a power supply path arranged to receive power from a power supply; a phase locked loop operatively connected to the power supply path and the clock path, comprising a capacitor, responsive to a phase and frequency difference between the clock signal and an output clock signal, for storing a voltage potential; a leakage current offset circuit operatively connected to the capacitor where the leakage current offset circuit is arranged to adjust the voltage potential; a programmable current source connected to the leakage current offset circuit where the programmable current source comprises a first current source and a first switch arranged to control the leakage current offset circuit; and a combinational logic circuit operatively connected to the programmable current source where the combinational logic circuit is arranged to selectively adjust the programmable current source.

According to one aspect of the present invention, a method for post-fabrication treatment of a phase locked loop including generating an output clock signal; comparing the output clock signal to an input clock signal; generating a current dependent on the comparing; storing a voltage potential on a capacitor dependent on the current; adjusting a leakage current of the capacitor using a leakage current offset circuit responsive to a programmable current source where the programmable current source comprises a first current source and a first switch arranged to control the leakage current offset circuit; and selectively adjusting the programmable current source using a combinational logic circuit operatively connected to the programmable current source.

According to one aspect of the present invention, an integrated circuit including means for generating an output clock signal dependent on an input clock signal; means for storing a voltage potential dependent on a phase and frequency difference between the input clock signal and the output clock signal; means for adjusting a leakage current of the means for storing the voltage potential; and means for selectively adjusting the means for adjusting.

Other aspects and advantages of the invention will be apparent from the following description and the appended claims.

DETAILED DESCRIPTION

Exemplary embodiments of the invention will be described with reference to the accompanying drawings. Like items in the drawings are shown with the same reference numbers.

The present invention relates to an adjustment and calibration system for post-fabrication adjustment of a PLL (200 shown in FIG. 2). In FIG. 2, the PLL (200) determines the phase and frequency relationship between the system clock signal (201) and the chip clock signal (217) based on a voltage potential maintained by the capacitor (206). Charge may leak from the capacitor (206), which, in turn, changes the stored voltage potential on the capacitor (206). Accordingly, the frequency of the voltage-controlled oscillator (210) may drift. The adjustment system includes combinational logic that controls a leakage current offset circuit using an adjustment circuit that compensates for such a leakage current. Thus, the leakage current of the capacitor (206) may be offset so that the capacitor (206) maintains a constant voltage potential.

Figure 3:
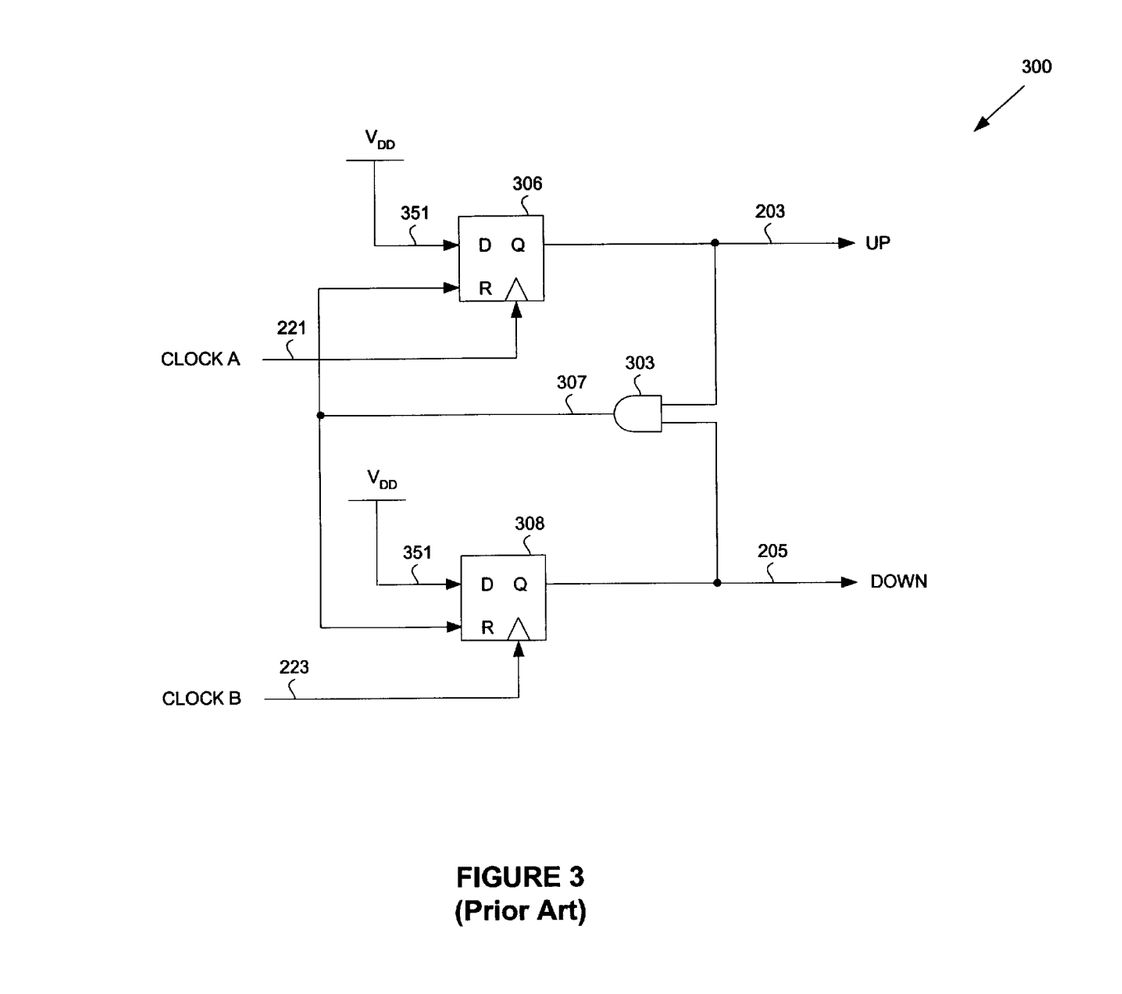
FIG. 3 shows a schematic diagram of a prior art phase-frequency detector.

FIG. 3 shows a block diagram of a typical phase-frequency detector (300). The phase-frequency detector (300) is representative of the phase-frequency detector (202) shown in FIG. 2. The phase-frequency detector (300) integrates the phase error that results between the clock A signal (221) and the clock B signal (223). The clock A signal (221) clocks a flip-flop (306) and the clock B signal (223) clocks a flip-flop (308).

When clock A signal (221) transitions from a low state to a high state, flip-flop (306) transfers the high state created by the power supply $V_{DD}$ (351) on an input of the flip-flop (306) to the up signal (203). When the clock B signal (223) transitions from a low state to a high state, flip-flop (308) transfers the high state created by the power supply $V_{DD}$ (351) on an input of the flip-flop (308) to the down signal (205). When both the up and down signals (203, 205) are at a high state, the AND gate (303) outputs a high state on signal line (307). The high state on signal line (307) resets both flip-flop (306) and flip-flop (308). The up and down signals. (203, 205) transition to a low state when the flip-flop (306) and flip-flop (308) are reset, respectively.

Figure 4:
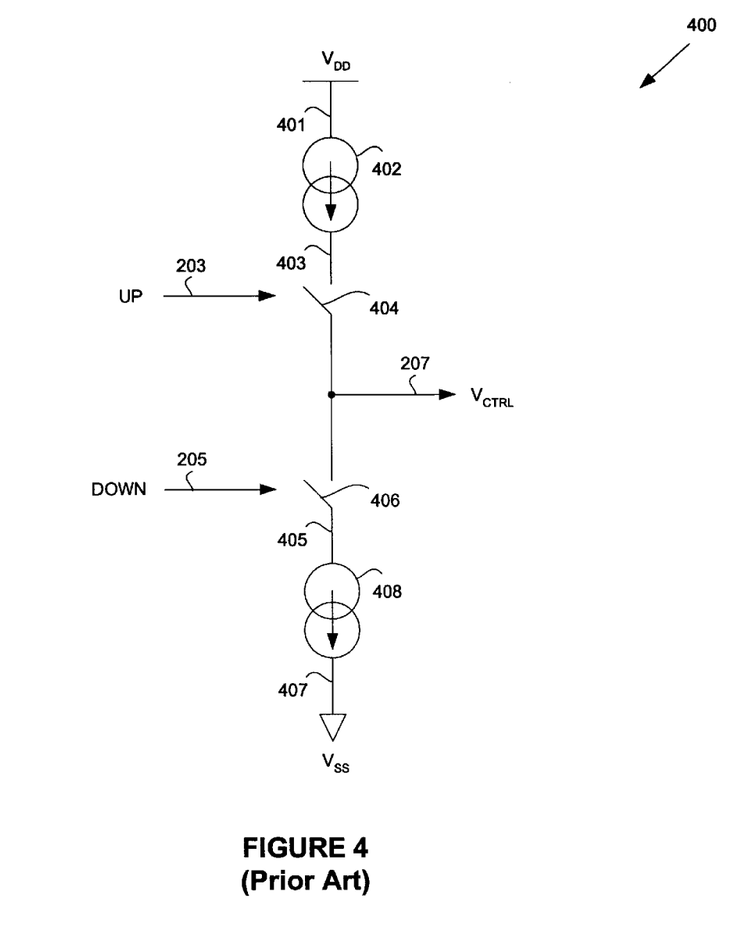
FIG. 4 shows a schematic diagram of a prior art charge pump.

FIG. 4 shows a block diagram of a typical charge pump (400). The charge pump (400) is representative of the charge pumps (204, 234) shown in FIG. 2. The charge pump (400) has two current sources (402, 408). The current source (402) is connected between the power supply $V_{DD}$ (401) and the signal line (403). The current source (408) is connected between the power supply $V_{SS}$ (407) and the signal line (405).

In FIG. 4, the up and down signals (203, 205) from the phase-frequency detector (300) shown in FIG. 3 determine whether switches (404, 406) are closed, respectively. When the up signal (203) is at a high state, the switch (404) is closed. The switch (404) is connected between signal (403) and the control voltage (207). When closed, the switch (404) allows the current generated by the current source (402) to add charge to the capacitor (206 shown in FIG. 2) using the control voltage (207).

When the down signal (205) is at a high state, the switch (406) is closed. The switch (406) is connected between signal (405) and the control voltage (207). When closed, the switch (406) allows the current generated by the current source (408) to remove charge from the capacitor (206 shown in FIG. 2) using the control voltage (207).

A short time period exists when both the up and down signals (203, 205) are at a high state. In FIG. 3, when both the up and down signals (203, 205) transition to a high state, the AND gate (303) resets the flip-flops (306, 308) by generating a high state on the signal- line (307). A finite time duration is needed for the AND gate (303) and the flip-flops (306, 308) to respond to this change in state. In FIG. 4, both the switches (404, 406) are closed when both the up and down signals (203, 205) signals are high. During this time, a nominal amount of charge is added to the capacitor (206 shown in FIG. 2). Some or all of the current generated by the current source (402) is transferred to the $V_{ss}$ power supply (407) through the current source (408).

Figure 5:
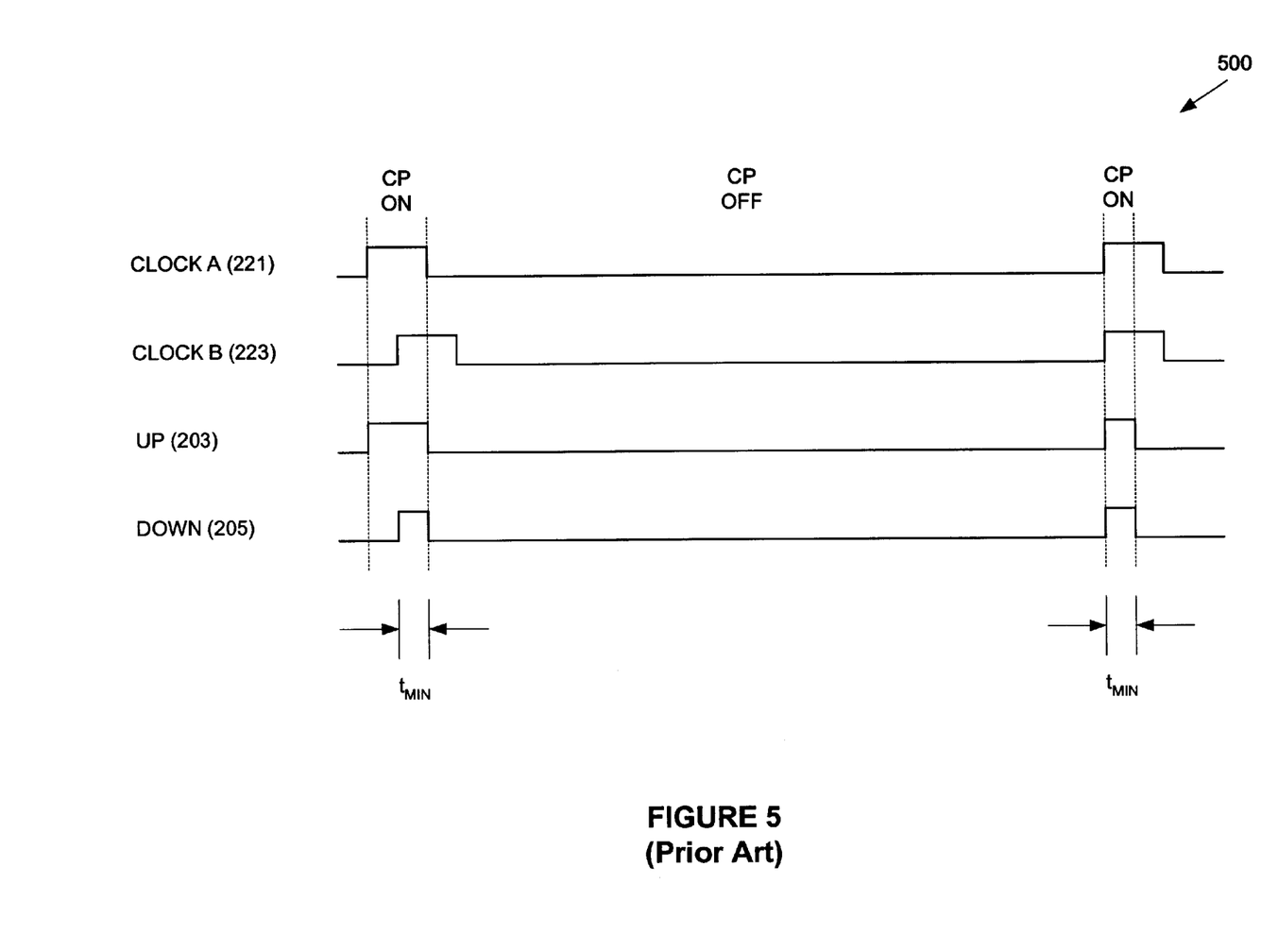
FIG. 5 shows a timing diagram for the phase-frequency detector shown in FIG. 3.

FIG. 5 shows a timing diagram (500) for the phase-frequency detector (300) shown in FIG. 3. The timing diagram (500) shows two clock cycles. The first clock cycle shows the clock B signal (223) lagging the clock A signal (221) (i.e., they are out of phase). The second cycle shows the clock B signal (223) properly aligned with the clock A signal (221).

In the first cycle, when the clock A signal (221) transitions from a low state to a high state, the up signal (203) transitions from a low state to a high state. When the clock B signal (223) transitions from a low state to a high state, the down signal (205) transitions from a low state to a high state. Because both the up and down signals (203, 205) are at a high state, the AND gate (303 shown in FIG. 3) resets both flip-flops (306, 308 shown in FIG. 3). The up and down signals (203, 205) output a low state when the flip-flops (306, 308 shown in FIG. 3) are reset, respectively.

In the first cycle, the up signal (203) is at a high state for a longer duration than the down signal (205). Accordingly, the current source (402 shown in FIG. 4) adds charge to the capacitor (206 shown in FIG. 2). If the down signal (205) was at a high state for a longer duration than the up signal (203), the current source (408 shown in FIG. 4) would remove charge from the capacitor (206 shown in FIG. 2). The change in the voltage potential maintained by the capacitor (206 shown in FIG. 2) affects the frequency of the voltage-controlled oscillator (210 shown in FIG. 2).

In FIG. 5, in the second cycle, both the clock A signal (221) and the clock B signal (223) transition from a low state to a high state at the same time. In other words, the clock A signal (201) and the clock B signal (223) are in phase. Accordingly, both the up and down signals (203, 205) transition from a low state to a high state at the same time. Also, both the flip-flops (306, 308 shown in FIG. 3) are reset simultaneously. Because a finite time duration (i.e., $t_{MIN}$) is needed for the AND gate (303 shown in FIG. 3) and the flip-flops (306, 308 shown in FIG. 3) to respond to the change in state, both the up and down signals (203, 205) have a finite time duration for which they are high. A nominal amount of charge is added to the capacitor (206 shown in FIG. 2) to maintain the present voltage potential on the control voltage (207 shown in FIG. 2).

In FIG. 5, the times during which the charge pump (400 shown in FIG. 4) may modify or maintain the charge on the capacitor (206 shown in FIG. 2) are indicated. When the clock A signal (221) and the clock B signal (223) are aligned, the time duration that the charge pump (400 shown in FIG. 4) is active is relatively small (i.e., $t_{MIN}$) compared to the time duration the charge pump is inactive. During the time the charge pump (400 shown in FIG. 4) is inactive (i.e., when both switches (404, 406) are open), the voltage potential on the capacitor (206 shown in FIG. 2) may drift due to leakage currents inherent with devices used to form the capacitor (206 shown in FIG. 2). Furthermore, the time duration that the charge pump (400 shown in FIG. 4) is inactive (i.e., when both switches (404, 406) are open) is increased during power reduction modes. As in the example above, the time duration between the charge pump (400 shown in FIG. 4) activity is increased 16 times in a power reduction mode compared to normal operation. The voltage potential on the capacitor (206 in FIG. 2) may drift a larger amount during the power reduction mode. A means to compensate for the drift and store the amount of compensation is needed.

Semiconductor capacitors are typically parallel plate capacitors formed by connecting the source and drain of a transistor together to create one terminal of the capacitor. The other terminal of the capacitor is formed by the gate connection of the transistor. Tunneling through the gate creates a path for leakage current. Leakage current causes the voltage potential originally stored on the capacitor to change. In a PLL, the capacitor (e.g., 206 shown in FIG. 2) helps maintain the amount of frequency produced by the voltage-controlled oscillator (210 shown in FIG. 2).

In FIG. 2, the relatively long time durations between the charge pump (204) updating the charge stored (i.e., voltage potential stored) on the capacitor (206) may result in a drift in the expected amount of frequency of the PLL (200). Although a designer may intend for an integrated circuit to have a particular value for the leakage current of the capacitor (206), actual values for these parameters are typically unknown until the integrated circuit has been fabricated (i.e., in a post-fabrication stage).

For example, a designer may intend for the frequency drift of the PLL (200) to be within in a particular range. The leakage current of the capacitor (206) may be unintentionally affected by many factors in the fabrication process. Because the leakage current cannot be redesigned in the post-fabrication stage without considerable temporal and monetary expenditures, these fabrication factors may cause the PLL (200) to have a different frequency drift range than the range the PLL (200) was designed. Consequently, the PLL (200) may have poor performance. Accordingly, there is a need for a technique and design that facilitates increased post-fabrication control of leakage current in the capacitor (206) of the PLL (200).

Figure 6:
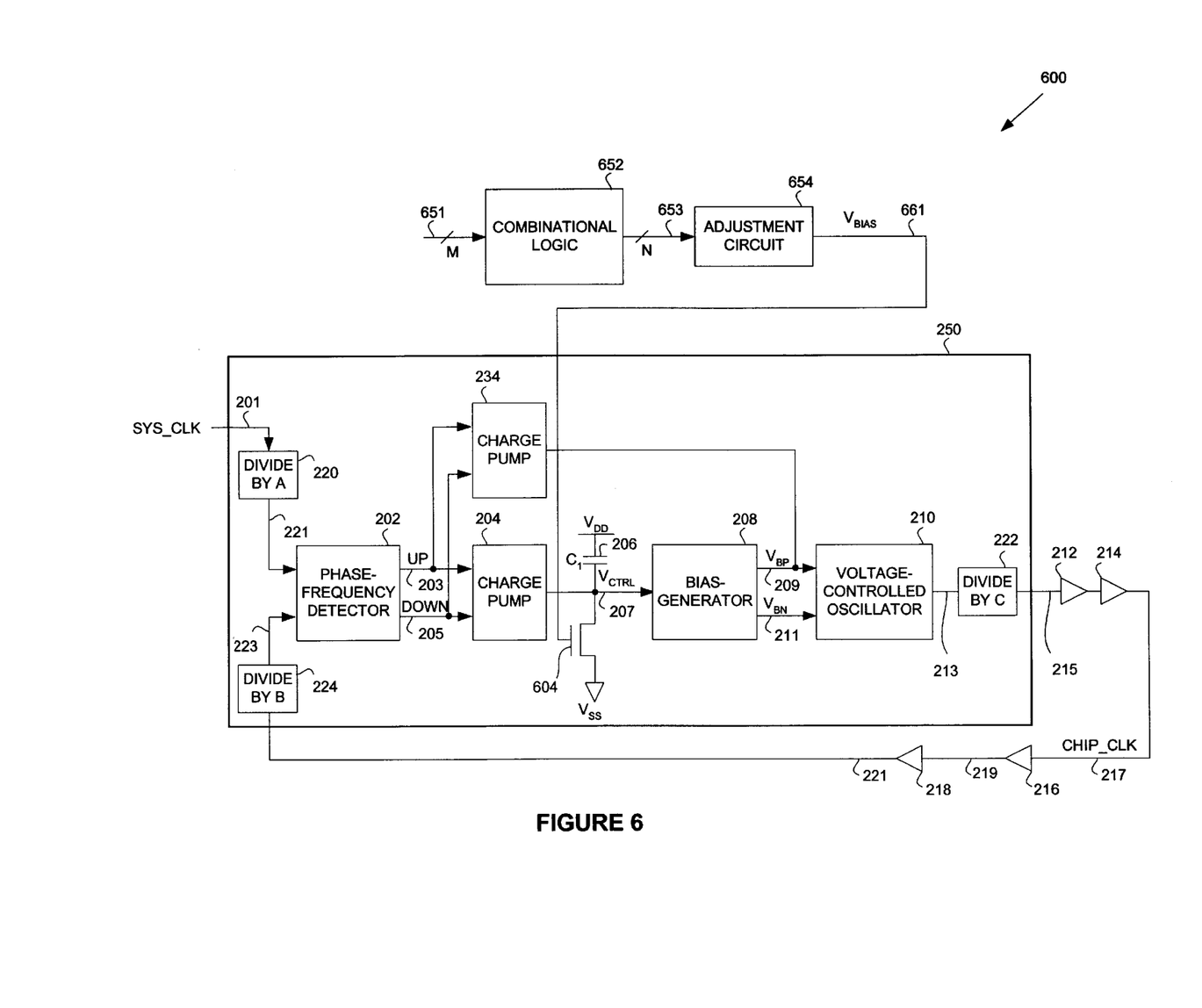
FIG. 6 shows a block diagram of a phase locked loop with an adjustable leakage current offset circuit in accordance with an embodiment of the present invention.

FIG. 6 shows an exemplary adjustable PLL (600) in accordance with an embodiment of the present invention. The phase-frequency detector (202), capacitor (206), bias-generator (208), and voltage-controlled oscillator (210) of the adjustable PLL (600) operate similar to those respective components described above with reference to FIG. 2.

In FIG. 6, a leakage current offset circuit (604) is connected between the control voltage (207) and a power supply $V_{SS}$. As the capacitor (206) leaks current, the voltage potential on the control voltage (207) has a tendency to drift toward the power supply $V_{DD}$. The leakage current offset circuit (604) is arranged to pull the voltage potential on the control voltage (207) toward a power supply $V_{SS}$. For example, an n-channel transistor is used as the leakage current offset circuit (604).

One of ordinary skill in the art will understand that in other embodiments, the capacitor (206) may be connected between the control voltage (207) and the power supply $V_{SS}$. In this case, the leakage current offset circuit (604) is connected between the control voltage (207) and the power supply $V_{DD}$. A leakage current offset circuit (604) in this arrangement may be a p-channel transistor.

In FIG. 6, an adjustment circuit (654) is used to adjust the leakage current offset circuit (604) to compensate for the leakage current of the capacitor (206). A bias voltage potential, $V_{BIAS}$ (661), is used to control the amount of compensation applied to offset the leakage current. The bias voltage potential (661) may be adjusted to increase, decrease, turn off, or maintain the amount of leakage current compensation (i.e., leakage current offset) produced by the leakage current offset circuit (604).

In FIG. 6, a combinational logic circuit (652) controls the adjustment circuit (654) using multiple adjustment signals N (653). The values of the multiple adjustment signals N (653) are determined by the combinational logic circuit (652). The combinational logic circuit (652) may communicate through an interface (not shown) using M communication lines (651). Those with ordinary skill in the art will understand that the interface and M communication lines (651) may take a wide variety of forms. The communication may be defined by an industry standard.

The combinational logic circuit (652) generates the multiple adjustment signals N (653) in response to the signal values on the M communication lines (651). The combinational logic circuit (652) may have $2^M$ input combinations. For example, M may equal four and N may equal six. Accordingly, sixteen combinations exist for values on the six adjustment signals N (653).

Those skilled in the art will understand that the adjustable PLL (600) may be analog, digital, or a combination of both types of circuits.

Figure 7:
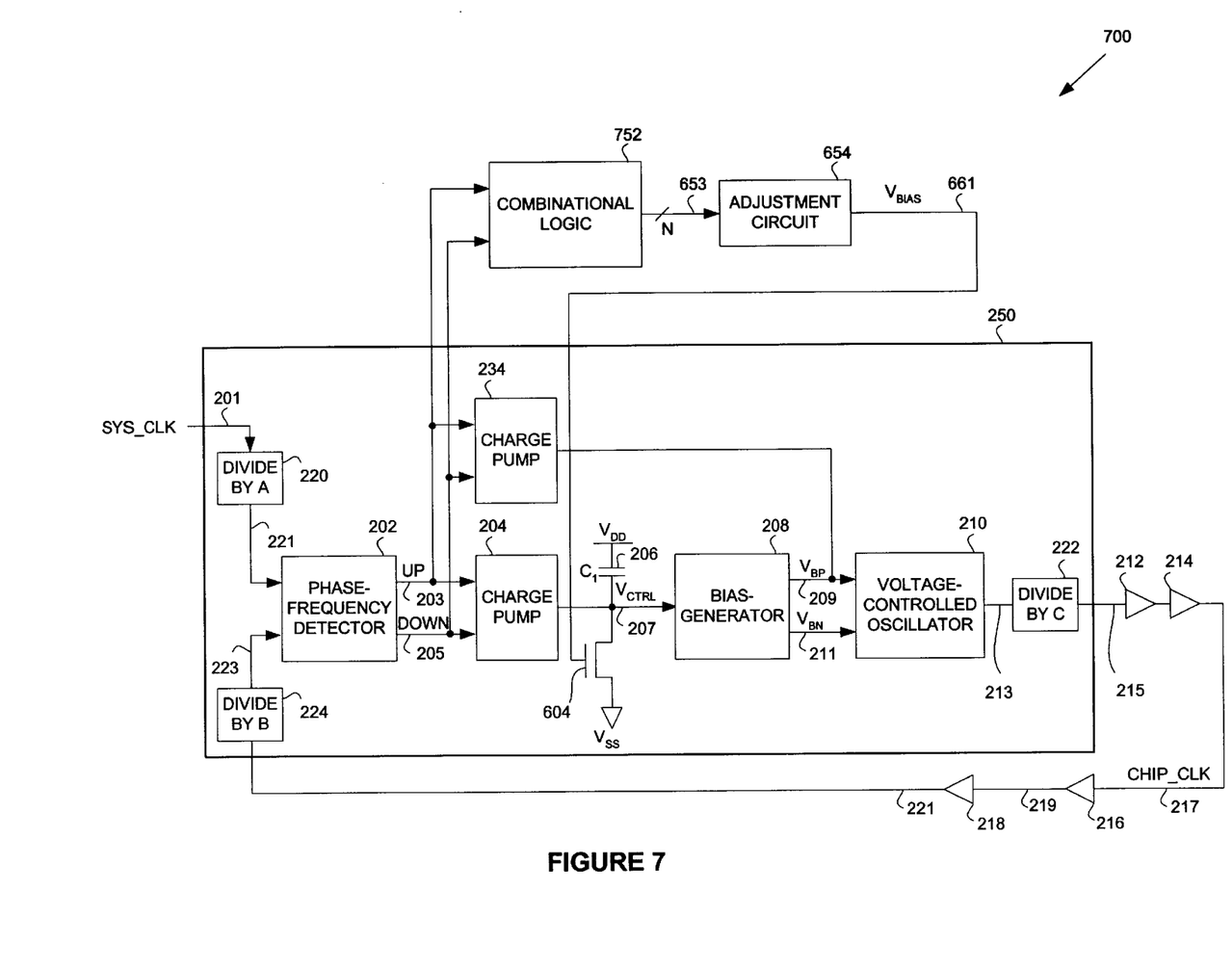
FIG. 7 shows a block diagram of a phase locked loop with an adjustable leakage current offset circuit in accordance with an embodiment of the present invention.

FIG. 7 shows an exemplary adjustable PLL (700) in accordance with an embodiment of the present invention. The phase-frequency detector (202), capacitor (206), bias-generator (208), voltage-controlled oscillator (210), leakage current offset circuit (604), and adjustment circuit (654) of the adjustable PLL (700) operate similar to those respective components described above with reference to FIG. 6.

In FIG. 7, a combinational logic circuit (762) controls the adjustment circuit (654) using multiple adjustment signals N (653). The values of the multiple adjustment signals N (653) are determined by the combinational logic circuit (762). The up and down signals (203, 205) from the phase-frequency detector (202) control the combinational logic circuit (762).

The combinational logic circuit (762) generates the multiple adjustment signals N (653) in response to the up and down signals (203, 205). In one or more embodiments, the combinational logic circuit (762) may use a state machine to generate the multiple adjustment signals N (653). In other embodiments, the combinational logic circuit (762) may be an analog circuit with an analog-to-digital converter to generate the multiple adjustment signals N (653). In other embodiments, the combinational logic circuit (762) and adjustment circuit (654) may be combined to perform a function similar to the charge pump (204) where this additional charge pump controls the leakage current offset circuit (604).

Those skilled in the art will understand that the adjustable PLL (700) may be analog, digital, or a combination of both types of circuits.

Figure 8:
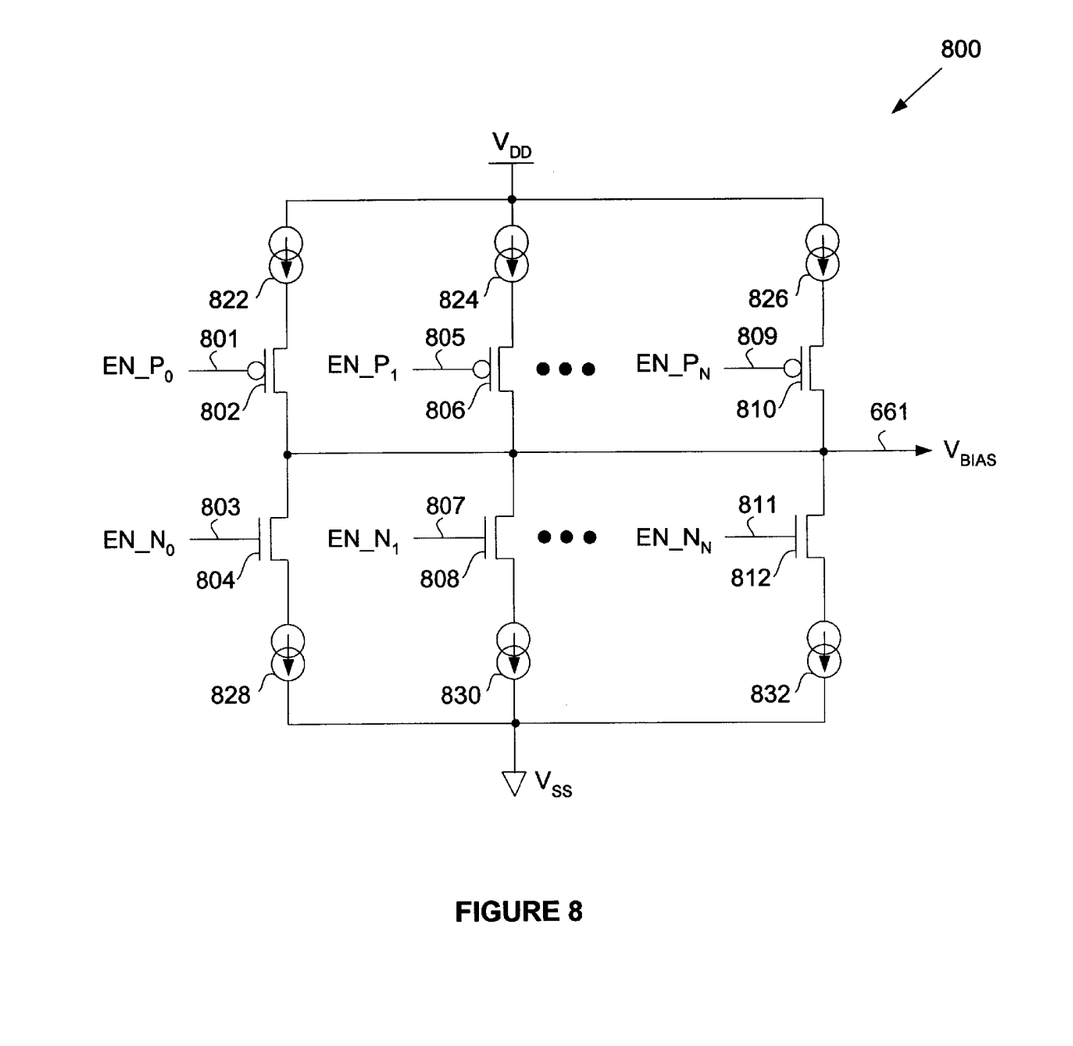
FIG. 8 shows a schematic diagram of a programmable current source in accordance with an embodiment of the present invention.

FIG. 8 shows a programmable current source (800) in accordance with an embodiment of the present invention. The programmable current source can be representative of the adjustment circuit (654) shown in FIGS. 6 and 7. The programmable current source (800) includes multiple p-channel transistors (802, 806, 810) connected respectively to multiple current sources (822, 824, 826) arranged in parallel with each other. The current sources (822, 824, 826) connect to the power supply $V_{DD}$ and the p-channel transistors (802, 806, 810), respectively. The p-channel transistors (802, 806, 810) have a common node on which the bias voltage potential $V_{BIAS}$ (661) is supplied to the leakage current offset circuit (604 shown in FIG. 6 and FIG. 7). The programmable current source (800) also includes multiple n-channel transistors (804, 808, 812) connected respectively to multiple current sources (828, 830, 832) arranged in parallel with each other. The current sources (828, 830, 832) connect to the power supply $V_{SS}$ and the n-channel transistors (804, 808, 812), respectively. The n-channel transistors (804, 808, 812) connect to the bias voltage potential $V_{BIAS}$ (661).

Each transistor has a corresponding individual control signal that turns "on" or "off" the respective p-channel transistors (802, 806, 810) and respective n-channel transistors (804, 808, 812). The p-channel transistors (802, 806, 810) have control signals EN_$P_0$ (801), EN_$P_1$ (805), and EN_$P_N$ (809) connected to their gates, respectively. The n-channel transistors (804, 808, 812) have control signals EN_$N_0$ (803), EN_$N_1$ (807), and EN_$N_N$ (811) connected to their gates, respectively. A "low" voltage potential on any of the EN_$P_X$ control signals (801, 805, 809), where "x" represents any index 0 through N, turns "on" the respective p-channel transistor (802, 806, 810). A "high" voltage potential on any of the EN_$N_X$ control signals (803, 807, 811), where "x" represents any index 0 through N, turns "on" the respective n-channel transistor (804, 808, 812).

A p-channel transistor (802, 806, 810) that is "on" changes the bias voltage potential (661) toward power supply $V_{DD}$. The change in the bias voltage potential (661) is caused by current flow provided by one or more of the current sources (822, 824, 826) onto the bias voltage potential (661). An n-channel transistor (804, 808, 812) that is "on" changes the bias voltage potential (661) toward power supply $V_{SS}$. The change in the bias voltage potential (661) is caused by current flow provided by one or more of the current sources (828, 830, 832) away from the bias voltage potential $V_{BIAS}$ (661). By selecting which p-channel transistors (802, 806, 810) and/or n-channel transistors (804, 808, 812) are "on," a selected change in the bias voltage potential $V_{BIAS}$ (661) may be achieved.

Those with ordinary skill in the art will understand that the current sources (822, 824, 826, 828, 830, 832) may be designed using transistors that operate in a saturated region. Furthermore, the p-channel transistors (802, 806, 810) and n-channel transistors (804, 808, 812) operate as switches to connect the current sources (822, 824, 826, 828, 830, 832) to ries the bias voltage potential $V_{BIAS}$ (661).

Those with ordinary skill in the art will understand that the p-channel transistors (802, 806, 810) and n-channel transistors (804, 808, 812) may be turned "on" individually or as a group. Each current source (822, 824, 826, 828, 830, 832) may provide a fixed amount of current; although, the current provided by each current source (822, 824, 826, 828, 830, 832) may differ from the other current sources (822, 824, 826, 828, 830, 832). The current sources (822, 824, 826, 828, 830, 832) may be designed to provide a linear, exponential, or other function as the current sources (822, 824, 826, 828, 830, 832) are connected or disconnected from bias voltage potential $V_{BIAS}$ (661).

The p-channel transistors (802, 806, 810) and n-channel transistors (804, 808, 812) may be used to add or subtract a fixed amount of current from the current on the bias voltage potential $V_{BIAS}$ (661). The p-channel transistors (802, 806, 810) and n-channel transistors (804, 808, 812) control the operation of the programmable current source (800). The programmable current source includes a plurality of current sources with each current source operatively connected to a switch. The switch controls the current flow from the current source.

In FIG. 6, the combinational logic circuit (652) generates a binary control word that determines which n-channel transistors (804, 808, 812 shown in FIG. 8) and p-channel transistors (802, 806, 810 shown in FIG. 8) are "on" and which are "off" in the adjustment circuit (654). Depending on the signal values of the M communication lines (651) received by the combinational logic circuit (652), multiple adjustment signals N (653) that represent EN_$N_X$ signals (803, 807, 811 in FIG. 8) and EN_$P_X$ signals (801, 805, 809 in FIG. 8) may turn "on" or turn "off" the p-channel transistors (802, 806, 810 shown in FIG. 8) and n-channel transistors (804, 808, 812 shown in FIG. 8) in the adjustment circuit (654). The bias voltage potential $V_{BIAS}$ (661) of the adjustment circuit (654) adjusts the leakage current offset circuit (604) to compensate for the leakage current of the capacitor (206).

In FIG. 7, the combinational logic circuit (752) generates a binary control word that determines which n-channel transistors (804, 808, 812 shown in FIG. 8) and p-channel transistors (802, 806, 810 shown in FIG. 8) are "on" and which are "off" in the adjustment circuit (654). The multiple adjustment signals N (653) that represent EN_$N_X$ signals (803, 807, 811 in FIG. 8) and EN_$P_X$ signals (801, 805, 809 in FIG. 8) may turn "on" or turn "off" the p-channel transistors (802, 806, 810 shown in FIG. 8) and n-channel transistors (804, 808, 812 shown in FIG. 8) in the adjustment circuit (654). The bias voltage potential $V_{BIAS}$ (661) of the adjustment circuit (654) adjusts the leakage current offset circuit (604) to compensate for the leakage current of the capacitor (206).

Advantages of the present invention may include one or more of the following. The adjustable PLL (600 in FIG. 6 and 700 in FIG. 7), after fabrication, may demonstrate undesirable operating characteristics that may not have been apparent from simulation. In one or more embodiments, because the adjustment circuit (654 shown in FIG. 6 and FIG. 7) may modify the operating characteristics of the adjustable PLL (600 in FIG. 6 and 700 in FIG. 7), the adjustable PLL (600 in FIG. 6 and 700 in FIG. 7) may be adjusted.

In one or more embodiments, because the adjustable PLL (600 in FIG. 6 and 700 in FIG. 7) may be fabricated with a means for compensating the leakage current of the capacitor (206 in FIG. 6 and in FIG. 7), fewer design iterations and higher confidence in the adjustable PLL (600 in FIG. 6 and 700 in FIG. 7) operating characteristics may be afforded.

In one or more embodiments, because an adjustment circuit (654 in FIG. 6 and FIG. 7) may modify the operating characteristics of the adjustable PLL (600 in FIG. 6 and 700 in FIG. 7), an investigation of the adjustable PLL's (600 in FIG. 6 and 700 in FIG. 7) response during operating conditions may be performed.

In one or more embodiments, a limited number of adjustable PLLs (600 in FIG. 6 and 700 in FIG. 7) may need to be tested to determine a desired adjustment that may be used for future, non-adjustable PLLs.

In one or more embodiments, a current source (822, 824, 826, 828, 830, 832) in programmable current source (800 in FIG. 8) may have a fixed current supply. A fixed current source may be easier to design and maintain at a fixed current supply. The programmable current source (800 in FIG. 8) may add, subtract, and/or redirect current from the current sources (822, 824, 826, 828, 830, 832) using digital control of switches.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit, comprising:

a clock path arranged to carry a clock signal;

a power supply path arranged to receive power from a power supply;

a phase locked loop operatively connected to the power supply path and the clock path, comprising a capacitor, responsive to a phase and frequency difference between the clock signal and an output clock signal, for storing a voltage potential;

a leakage current offset circuit operatively connected to the capacitor, wherein the leakage current offset circuit is arranged to adjust the voltage potential;

a programmable current source connected to the leakage current offset circuit, wherein the programmable current source comprises a first current source and a first switch arranged to control the leakage current offset circuit; and a combinational logic circuit operatively connected to the programmable current source, wherein the combinational logic circuit is arranged to selectively adjust the programmable current source.

2. The integrated circuit of claim 1, wherein the first switch is a first transistor.

3. The integrated circuit of claim 1, wherein the first current source is a transistor operating in a saturated region.

4. The integrated circuit of claim 1, wherein the first current source and the first switch are arranged to control current flow between a first voltage potential and an output of the programmable current source dependent on a first control signal, and wherein the output is operatively connected to the leakage current offset circuit.

5. The integrated circuit of claim 4, the programmable current source further comprising:

a second current source and a second switch arranged to control current flow between a second voltage potential and the output of the programmable current source dependent on a second control signal.

6. The integrated circuit of claim 5, wherein the second switch is a second transistor.

7. The integrated circuit of claim 5, wherein the first current source and the second current source provide different amounts of current.

8. The integrated circuit of claim 1, wherein the leakage current offset circuit comprises a transistor, and wherein the programmable current source is operatively connected to a gate of the transistor.

9. The integrated circuit of claim 1, wherein the combinational logic circuit is arranged to adjust the programmable current source to one of a fixed number of possible settings.

10. The integrated circuit of claim 1, wherein the combinational logic circuit is arranged to adjust the programmable current source responsive to the phase and frequency difference between the clock signal and the output clock signal.

11. A method for post-fabrication treatment of a phase locked loop, comprising:

generating an output clock signal;

comparing the output clock signal to an input clock signal;

generating a current dependent on the comparing;

storing a voltage potential on a capacitor dependent on the current;

adjusting a leakage current of the capacitor using a leakage current offset circuit responsive to a programmable current source, wherein the programmable current source comprises a first current source and a first switch arranged to control the leakage current offset circuit; and selectively adjusting the programmable current source using a combinational logic circuit operatively connected to the programmable current source.

12. The method of claim 11, wherein the first switch is a first transistor.

13. The method of claim 11, wherein the first current source is a transistor operating in a saturated region.

14. The method of claim 11, further comprising:

using the first current source and the first switch to control current flow between a first voltage potential and an output of the programmable current source dependent on a first control signal, wherein the output is operatively connected to the leakage current offset circuit.

15. The method of claim 14, further comprising:

using a second current source and a second switch arranged to control current flow between a second voltage potential and the output of the programmable current source dependent on a second control signal.

16. The method of claim 15, wherein the second switch is a second transistor.

17. The method of claim 15, wherein the first current source and the second current source provide different amounts of current.

18. The method of claim 11, wherein the adjusting comprises:

using the programmable current source to operatively control a gate of a transistor in the leakage current offset circuit.

19. The method of claim 11, wherein the selectively adjusting comprises:

using the combinational logic circuit to adjust the programmable current source to one of a fixed number of possible settings.

20. The method of claim 11, wherein the selectively adjusting is responsive to the comparing.

21. An integrated circuit, comprising:

means for generating an output clock signal dependent on an input clock signal;

means for storing a voltage potential dependent on a phase and frequency difference between the input clock signal and the output clock signal;

means for adjusting a leakage current of the means for storing the voltage potential; and means for selectively adjusting the means for adjusting.

* * * * *